United States Patent [19]

Hamburgen

[11] Patent Number: 4,966,226

[45] Date of Patent: Oct. 30, 1990

[54] COMPOSITE GRAPHITE HEAT PIPE APPARATUS AND METHOD

[75] Inventor: William R. Hamburgen, Menlo Park, Calif.

[73] Assignee: Digital Equipment Corporation, Maynard, Mass.

[21] Appl. No.: 458,592

[22] Filed: Dec. 29, 1989

[51] Int. Cl.$^5$ .............................................. F28D 15/02
[52] U.S. Cl. ........................ 165/104.26; 165/104.33; 165/110; 165/185; 165/905; 361/385; 29/890.07; 29/890.032
[58] Field of Search .................. 165/104.26, 104.33, 165/110, 185, 905; 361/385; 29/157.3 H

[56] References Cited

U.S. PATENT DOCUMENTS

| | | | |
|---|---|---|---|
| 3,913,666 | 10/1975 | Bayliss | 165/185 |
| 4,116,266 | 9/1978 | Sawata et al. | 165/104.26 |
| 4,603,731 | 8/1986 | Olsen | 165/185 |
| 4,832,118 | 5/1989 | Scanlon et al. | 165/905 |

Primary Examiner—Albert W. Davis, Jr.
Attorney, Agent, or Firm—Flehr, Hohbach, Test, Albritton & Herbert

[57] ABSTRACT

A heatpipe having an evaporator fabricated out of composite graphite material and having a hemispherical shape. Two methods of fabricating such an evaporator include (1) bundling and bonding a plurality of composite graphite fibers and (2) providing a plurality of composite graphite fiber mats and compressing the mats about a central point. In either method the composite graphite material is configured to have a generally hemispherical outer surface. Evaporators having a generally hemispherical outer surface and made of metal, such as Cu, without graphite, are also disclosed.

17 Claims, 2 Drawing Sheets

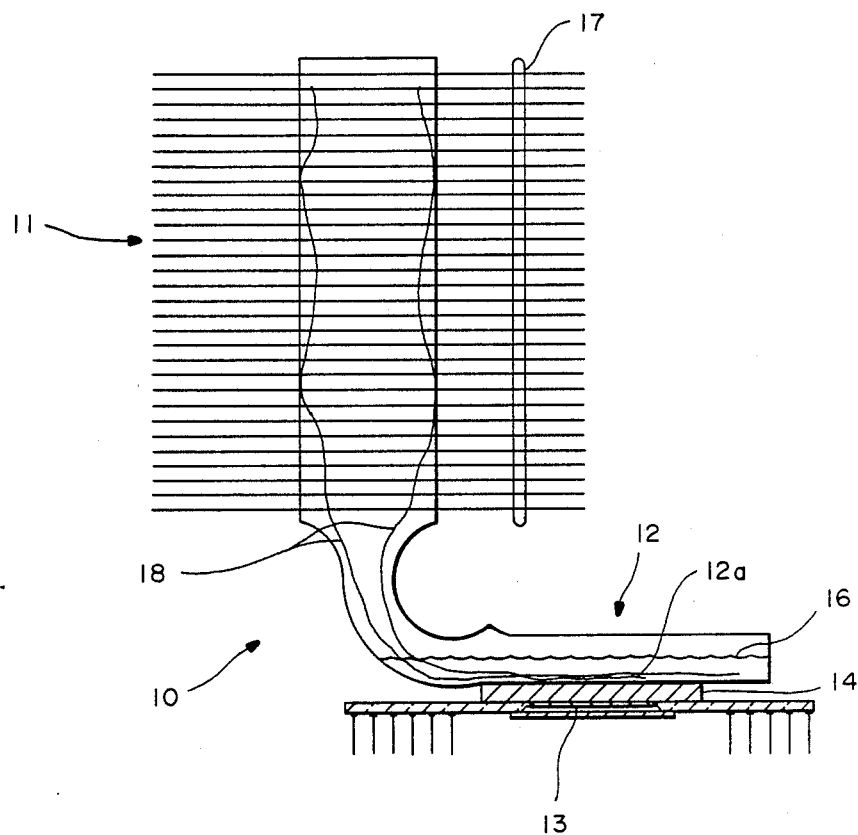
FIG.—1

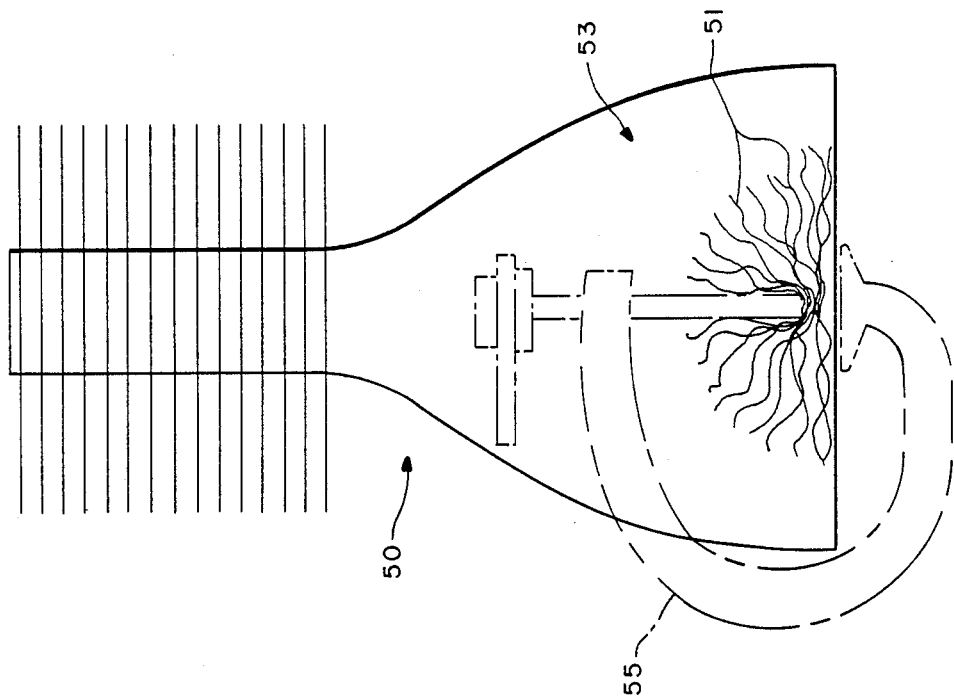
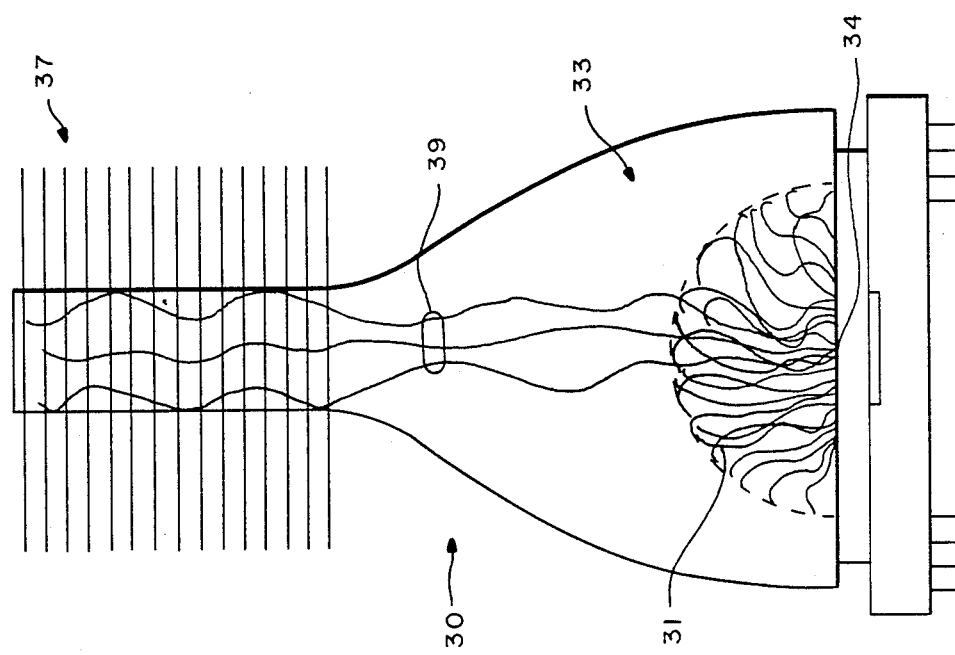

COMPOSITE GRAPHITE HEAT PIPE APPARATUS AND METHOD

BACKGROUND OF THE INVENTION

1. Field of the Invention

The present invention relates to heatpipes for cooling integrated circuits. More specifically, the present invention relates to a heatpipe that utilizes a composite containing graphite fibers in a configuration which approximates a hemisphere.

2. Summary of the Prior Art

Referring to FIG. 1, a cross-sectional view of a heatpipe of the prior art is shown. Heatpipes 10 are well known for their use in cooling integrated circuits. The essence of a heatpipe 10 is to provide an evaporator in close proximity to a high power integrated circuit so that heat from the integrated circuit may be turned into vapor and rapidly carried away from the heat source.

A heatpipe 10 is basically comprised of two regions: the condenser 11 and the evaporator 12. The evaporator 12 is located either next to or on top of the integrated circuit 13 (hereinafter sometimes referred to as "die 13"). A thermal spreader 14 is sometimes placed between the die 13 and the evaporator 12. The thermal spreader 14 may be made of copper (Cu), molybdenum, ceramic or other material and serves to increase the surface area over which heat from the die 13 contacts the evaporator 12.

A fluid 16 is provided in the evaporator 12. Heat propagates from the die 13 to the evaporator 12 where it heats the fluid 16 bringing about boiling. The boiling fluid absorbs heat because a phase change from liquid to vapor requires heat energy. Fluid vapor is transported up the heatpipe 10 away from the heat source (the die 13). The vapor transfers heat to the condenser 11. At the condenser 11, the heat is transferred to the heatpipe fins 17 where it is removed to the environment. The vapor condenses in the condenser 11 and the condensing liquid flows back down to the evaporator where it may again be boiled, thereby repeating the process.

The configuration of the heatpipe 10, utilizing vapor to carry away heat, is used because heat transfer via mass transfer in a vapor can be more efficient than conduction in a solid. If, for example, instead of being hollow, the heatpipe 10 were made of solid Cu, then the heat would propagate a limited distance into the Cu and no farther. The result is that the heat source (13) would run hotter, which is undesirable.

A heatpipe 10 may also have a wick 18. A wick 18 is usually a woven mat, made of Cu or some other material, which moves condensing fluid from the condenser region 11 to the evaporator 12 by capillary action. The use of a wick 18 permits a heatpipe 10 to be positioned arbitrarily with respect to gravity. Surface tension carries the condensing fluid along the wick 18 towards where the wick 18 is dry, thereby returning fluid to the evaporator 12 where it may be boiled again.

There are shortcomings to this prior art arrangement. One shortcoming is the rate at which heat is transferred from the evaporator surface 12a to the fluid 16. This is a function of the surface area of the evaporator surface 12a. The greater the surface area, the greater the rate of heat exchange. Although thermal spreaders 14 and finned evaporators have been used to effectively increase the area of the evaporator surface 12a which receives die 13 heat, they are of limited significance in efficiently providing heat transfer.

SUMMARY OF THE INVENTION

Accordingly, it is an object of the present invention to provide a heatpipe which has an increased evaporator surface area.

It is another object of the present invention to provide a heatpipe having an evaporator which is made of composite graphite material and thereby takes advantage of the properties of this material.

It is yet another object of the present invention to provide a heatpipe that has a more efficiently shaped evaporator for cooling an integrated circuit, that evaporator shape approximating a hemisphere.

The attainment of these and related objects may be achieved through use of the novel composite graphite heatpipe apparatus and method herein disclosed. A composite graphite heatpipe in accordance with this invention comprises a heatpipe having an evaporator fabricated out of composite graphite metal material and having a generally hemispherical shape. Two methods of fabricating such an evaporator include (1) bundling and bonding a plurality of composite graphite fibers and (2) providing a plurality of composite graphite fiber mats and compressing the mats about a central point. In either method the composite graphite material is configured to have a generally hemispherical outer surface. Evaporators having a generally hemispherical outer surface and made of metal, such as Cu, without graphite, are also disclosed.

The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

FIG. 1 is a cross-sectional view of a heatpipe of the prior art.

FIG. 2 is a cross-sectional view of a heatpipe of the preferred embodiment.

FIG. 3 is a cross-sectional view of an alternative heatpipe of the preferred embodiment.

DETAILED DESCRIPTION OF THE PREFERRED EMBODIMENT

Referring to FIG. 2, a cross-sectional view of a heatpipe 30 of the preferred embodiment is shown. Graphite fibers have recently become available that have extraordinary axial thermal conductivity. Both Amoco and DuPont have the technology for making these pitch based fibers. An example is the Amoco P-130x material which has a thermal conductivity of 1100 W/m-k, three times that of Cu. These graphite fibers are being used to make metal matrix composites with low planar expansion coefficients and high thermal conductivity. Aluminum and copper are both suitable matrix materials, and other metals may be used. The term composite graphite used herein is intended to mean composite graphite-metal, unless otherwise stated.

In the preferred embodiment, composite graphite fibers are used which consist of graphite fibers coated with Cu. The copper plated graphite fibers may be joined using hot isostatic pressing or diffusion bonding. The composite fibers provide the excellent axial thermal conductivity of graphite with the joining strength and relatively good thermal properties of Cu. The fibers are further shaped, as described below, to provide an ideal evaporator surface configuration.

If it is desired to cool a particular device, the ideal evaporator surface for cooling that item would be spherical, having a surface configuration resembling a "fuzzy ball." Since integrated circuits are planar in configuration, one side being adjacent to a circuit board, the ideal evaporator surface is hemispherical in configuration. The fibers, accordingly, are configured as fiber bundles (FIG. 2) or as mats (FIG. 3) to accomplish this configuration.

To create the desired configuration, composite fibers 31 are grouped into a bundle (all identified as 31 because they are an indistinguishable collection of fibers). The fibers 31 may be grouped or bundled in "tows" which are collections of multiple fibers, often 1000 to 2000 fibers per tow. These tows, or yarns as they are sometimes referred to, may also be bunched and braided. The fibers 31 are connected to a die attach platform 34 of the evaporator 30. The method of connection includes either soldering, fusing or pressing operations. The desired result, regardless of connection method, is to directly couple heat into the fibers 31.

A more specific process for making the appropriate evaporator configuration is to take a bundle of fibers 31 and bond them together in a short zone at the midpoint. These bonded fiber bundles 31 are then sliced to form two "shaving brushes." A shaving brush (a split fiber bundle 31) is then bonded to the die attach platform 34. The die attach platform 34 is machined and/or plated to form the actual attachment platform. The condenser assembly 37 is attached and the entire assembly cleaned. Pumpout, the act of vacuum cleaning the heatpipe and evaporating atmospheric gases, and fluid fill are then conducted to complete the heatpipe 30 assembly. Alternative methods of consolidating the fibers 31 include means such as swaging or rolling a metal collar around them to make a confined plug. Potting in an organic or inorganic cement is also possible.

Such a composite graphite heatpipe 30 permits several advantages over more conventional structures. The high fiber axial conductivity permit enormous effective surface area enhancement. As the fibers leave the die attach platform they fan out in three dimensions to approximate hemispherical spreading which is more effective than simple planar spreading. In addition, if these fibers are woven into yarn bundles prior to consolidation, a labyrinth of passages are formed which provide a wealth of nucleation sites, permitting high heat fluxes with low wall superheat.

Fibers 31 could also be provided that are long enough to stretch into the condenser 37, thereby providing a wick 39. The wick fibers 39 are longer than those needed for evaporator performance and the extended portion is held against the walls in the condenser area 37. This permits operation of the heatpipe 30 in an arbitrary orientation. The fiber bundles 31 and wicks 39, in this instance, have a primary function of expanding surface area for heat removal and a secondary function of returning condensing fluid to the evaporator 33.

Additionally, composite fibers could be added in the vicinity of the die attach platform 34, and placed at right angles to the bundles 31. These additional fibers reduce the planar expansion coefficient, reducing die stress, and permit some degree of planar thermal spreading to be exploited.

Several other advantages would apply to heatpipes of this design, but made of more conventional materials. For example, a configuration of soldered arrays of copper wires could be pressed and fused or soldered into a packed hexagonal assembly. Variations such as these are within the scope of the present invention.

Referring to FIG. 3, a cross-sectional view of an alternative heatpipe 50 of the preferred embodiment is shown. The heatpipe 50 is essentially the same as the heatpipe 30 (of FIG. 2), except that the evaporator 53 is made out of composite graphite mats instead of individual or bundles of composite graphite fibers 31. The above mentioned Cu coated graphite fibers may be woven into matrixes 51 (hereinafter "mats 51"). The mats are placed one on top of another until they form a stack. A "C" clamp 55 is utilized to apply a great force to the center of the stack forcing the edges of the mats to turn upward, thereby approximating a hemisphere, in much the same way pressure in the middle of a pile of tissues causes the edges of the tissues to move upward. The stack of mats bound by the C clamp 55 are placed in a furnace and permanently fused together. When the C clamp 55 is removed, the mats stay compressed. An alternative method of creating this stack is to provide alternating layers of graphite and Cu foil to produce a stack. The stack is then compressed and fused as above.

The mats 51 are connected to the die attach region 54, in much the same manner as the fibers 31 are connected to die attach region 34. The evaporator 53 provides the same attach region 34. The evaporator 53 provides the same advantages and accommodations as described above with reference to FIG. 2. One additional advantage provided by the use of mats is that the expansion coefficient in the middle (or compressed region) can be engineered to (1) more evenly match the expansion coefficient of silicon and (2) cause the mats 51 to behave more like individual fibers.

Both techniques effectively form a "porous" fuzzy ball which greatly increases the surface area of the evaporator and increases the number of nucleation sites. The rate at which heat is removed from an integrated circuit is also increased.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A heatpipe apparatus, comprising:
   a reservoir member having an attachment surface; and
   evaporator means coupled to said attachment surface and having a configuration which approximates a hemisphere for conducting heat away from said attachment surface.

2. The apparatus of claim 1 wherein said evaporator means comprises a graphite-metal composite.

3. The apparatus of claim 1 wherein said evaporator means comprises a metal from the class containing Cu and Al.

4. The apparatus of claim 2 wherein said composite graphite evaporator means comprises:
   graphite; and
   metal from the class containing Cu and Al.

5. The apparatus of claim 2 wherein said composite graphite evaporator means further comprises a plurality of composite graphite fibers, connected to said attachment surface and positioned so as to approximate said hemisphere.

6. The apparatus of claim 2 wherein said composite graphite evaporator means further comprises a plurality of composite graphite mats compressed about a central area.

7. An evaporator apparatus for a heatpipe, comprising:
   a reservoir having an attachment surface; and
   composite graphite evaporator means coupled to said attachment surface and configured to approximate a hemisphere in shape for dissipating heat from said attachment surface.

8. The apparatus of claim 7 wherein said composite graphite evaporator means further comprises a plurality of composite graphite fibers coupled to said attachment surface, said fibers being configured and bonded so that said plurality of fibers approximates said hemisphere.

9. The apparatus of claim 7 wherein said composite graphite evaporator means includes a plurality of composite graphite mats, one on top of the other, each of said plurality of composite graphite mats having a central and outer region, said central regions of said mats being compressed together so that said outer regions of said mats spread upward, said plurality of composite graphite mats thereby approximating said hemisphere.

10. The apparatus of claim 7 wherein said evaporator further includes a wick.

11. A heatpipe apparatus for cooling an integrated circuit, comprising:
    a condenser coupled to an evaporator;
    said evaporator located in close proximity to an integrated circuit; and
    composite graphite material in said evaporator having an outer surface with points on said outer surface having a generally equal radius from said integrated circuit.

12. The apparatus of claim 11 wherein said evaporator means is configured to have a wealth of nucleation sites.

13. A method for fabricating an evaporator for a heatpipe, comprising the steps of:
    configuring a composite graphite material to form an evaporator approximating the shape of a hemisphere.

14. The method of claim 13 further comprises the step of:
    configuring composite graphite fibers to form an evaporator approximating the shape of a hemisphere.

15. The method of claim 13 further comprises the step of:
    configuring composite graphite mats to form an evaporator approximating the shape of a hemisphere.

16. A method for fabricating an evaporator for a heatpipe, comprising the steps of:
    compressing a plurality of mats containing graphite metal composite to approximately form a hemispherical shape;
    fusing said mats approximately formed in said hemispherical shape to maintain said shape; and
    attaching to said fused mats to an evaporator surface.

17. A method of fabricating an evaporator for a heatpipe, comprising the steps of:
    forming a plurality of graphite metal composite fibers into a plurality of bundles;
    forming said bundles to approximate a hemispherical shape; and
    fusing said bundles formed in an approximately hemispherical shape to an evaporator surface.

* * * * *